United States Patent
Yamashita

(10) Patent No.: US 8,171,444 B2
(45) Date of Patent: May 1, 2012

(54) LAYOUT DESIGN METHOD, APPARATUS AND STORAGE MEDIUM

(75) Inventor: Ryoichi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 321 days.

(21) Appl. No.: 12/561,583

(22) Filed: Sep. 17, 2009

(65) Prior Publication Data
US 2010/0077369 A1 Mar. 25, 2010

(30) Foreign Application Priority Data

Sep. 22, 2008 (JP) ................. 2008-241942

(51) Int. Cl.
*G06F 17/50* (2006.01)
(52) U.S. Cl. ........ 716/124; 716/122; 716/123; 716/125; 716/129; 716/130; 716/131
(58) Field of Classification Search .................. 716/122, 716/123, 124, 125, 129, 130, 131
See application file for complete search history.

(56) References Cited

U.S. PATENT DOCUMENTS

| | | | |
|---|---|---|---|
| 7,117,468 B1 * | 10/2006 | Teig et al. | 716/129 |
| 7,155,697 B2 * | 12/2006 | Teig et al. | 716/129 |
| 2003/0014722 A1 | 1/2003 | Munemura et al. | |
| 2007/0256045 A1 * | 11/2007 | Lin et al. | 716/13 |

FOREIGN PATENT DOCUMENTS

| | | |
|---|---|---|
| JP | H08-044784 A | 2/1996 |
| JP | 2002-215704 A | 8/2002 |
| JP | 2003-030266 A | 1/2003 |

* cited by examiner

*Primary Examiner* — Phallaka Kik
(74) *Attorney, Agent, or Firm* — Fujitsu Patent Center

(57) ABSTRACT

A layout design support apparatus divides a first module obtained by dividing a semiconductor integrated circuit into a plurality of second modules in order to support a layout design for determining the disposition of each cell constituting the semiconductor integrated circuit and wiring, and makes the detailed design of a layout for determining the disposition of each cell in the second module and wiring for each second module.

13 Claims, 20 Drawing Sheets

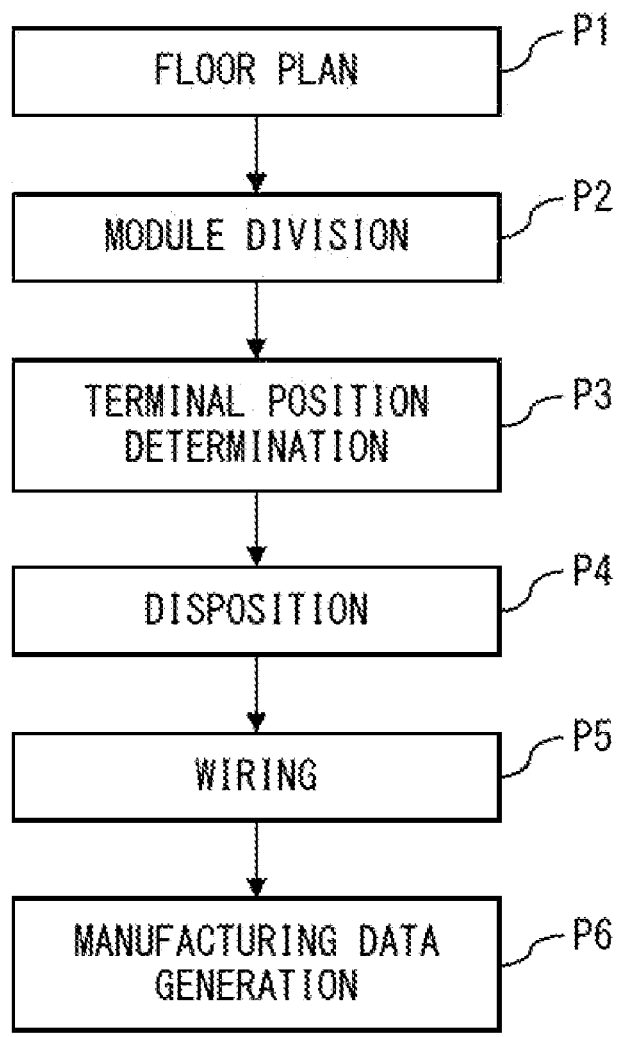
F I G. 4

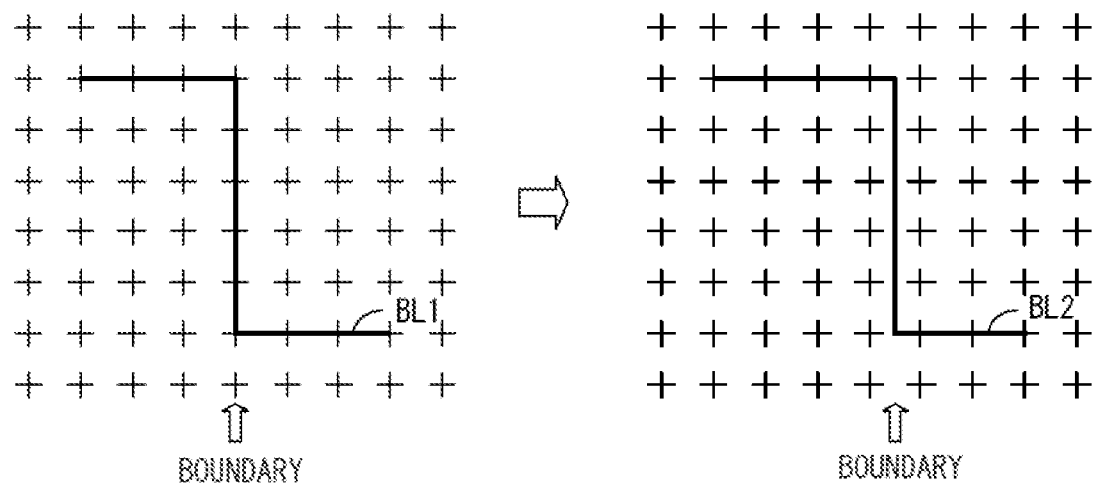
F I G. 7

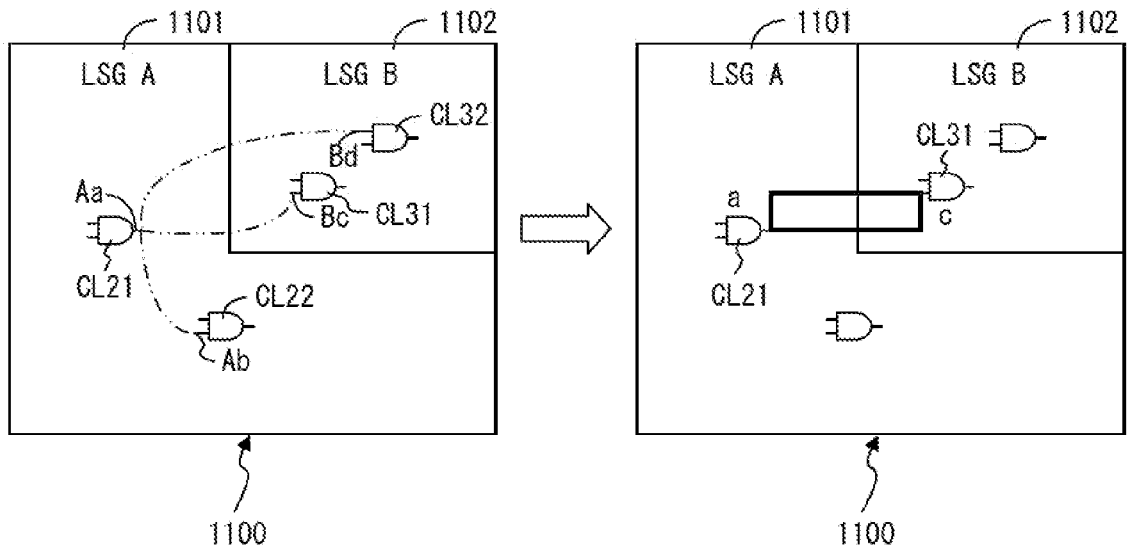
F I G. 1 1

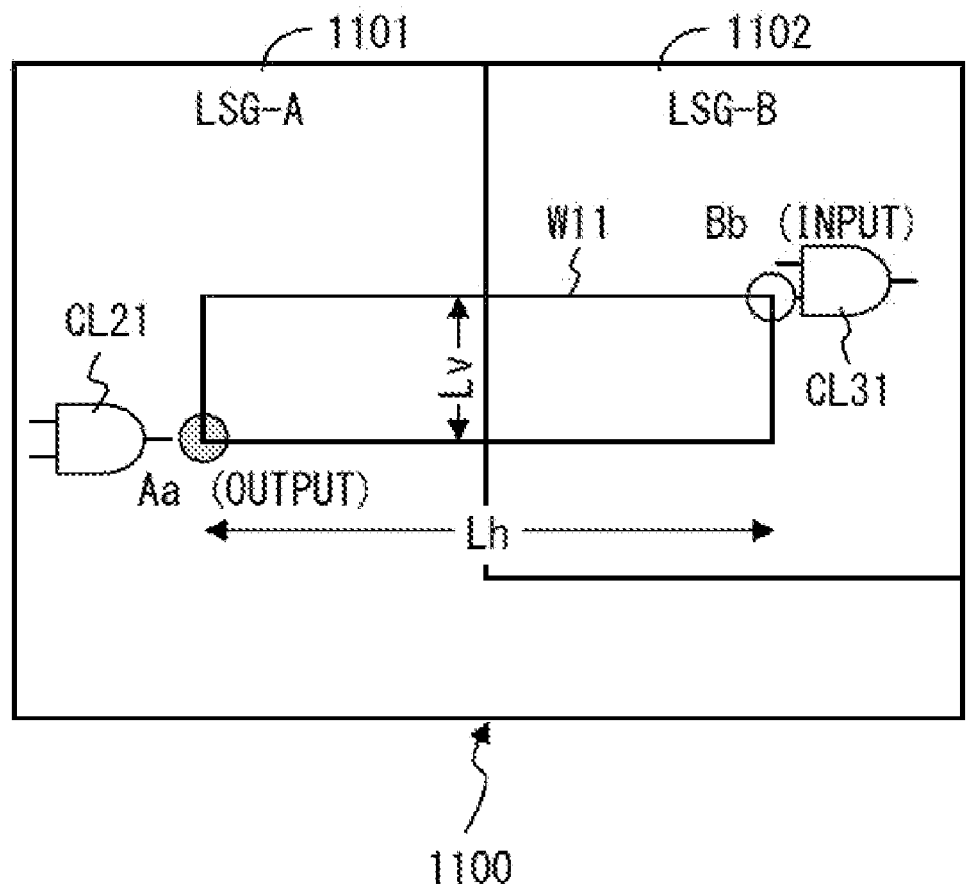
F I G. 12

| WIRE LENGTH [Grid] | WIRING LAYER | PITCH [Grid] |
|---|---|---|
| 0 – 200 | L1, L2 | 1 |
| 201–500 | L3, L4 | 2 |
| 501–1000 | L5, L6 | 3 |
| 1001 – | L7, L8 | 4 |

FIG. 13

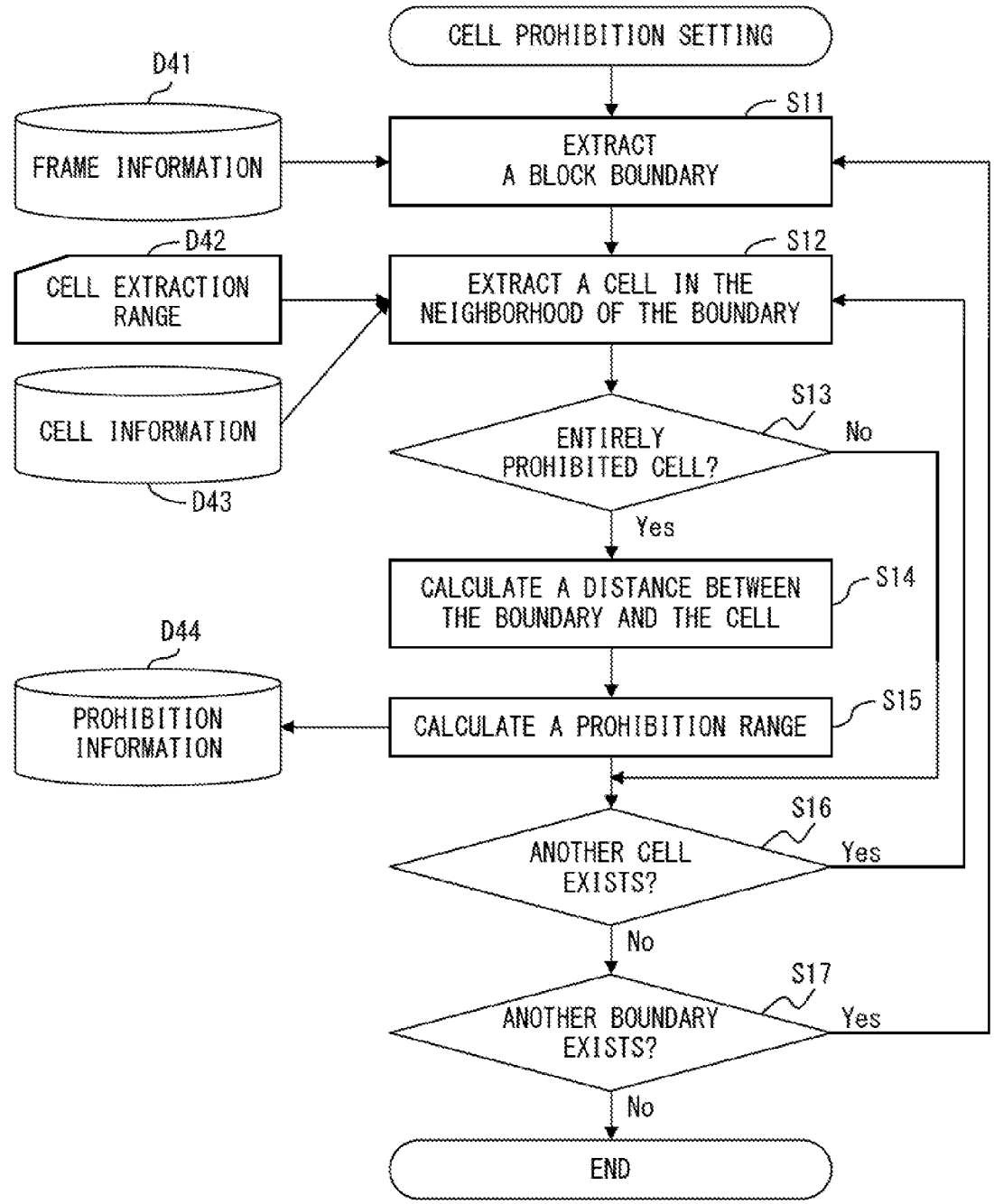
F I G. 16

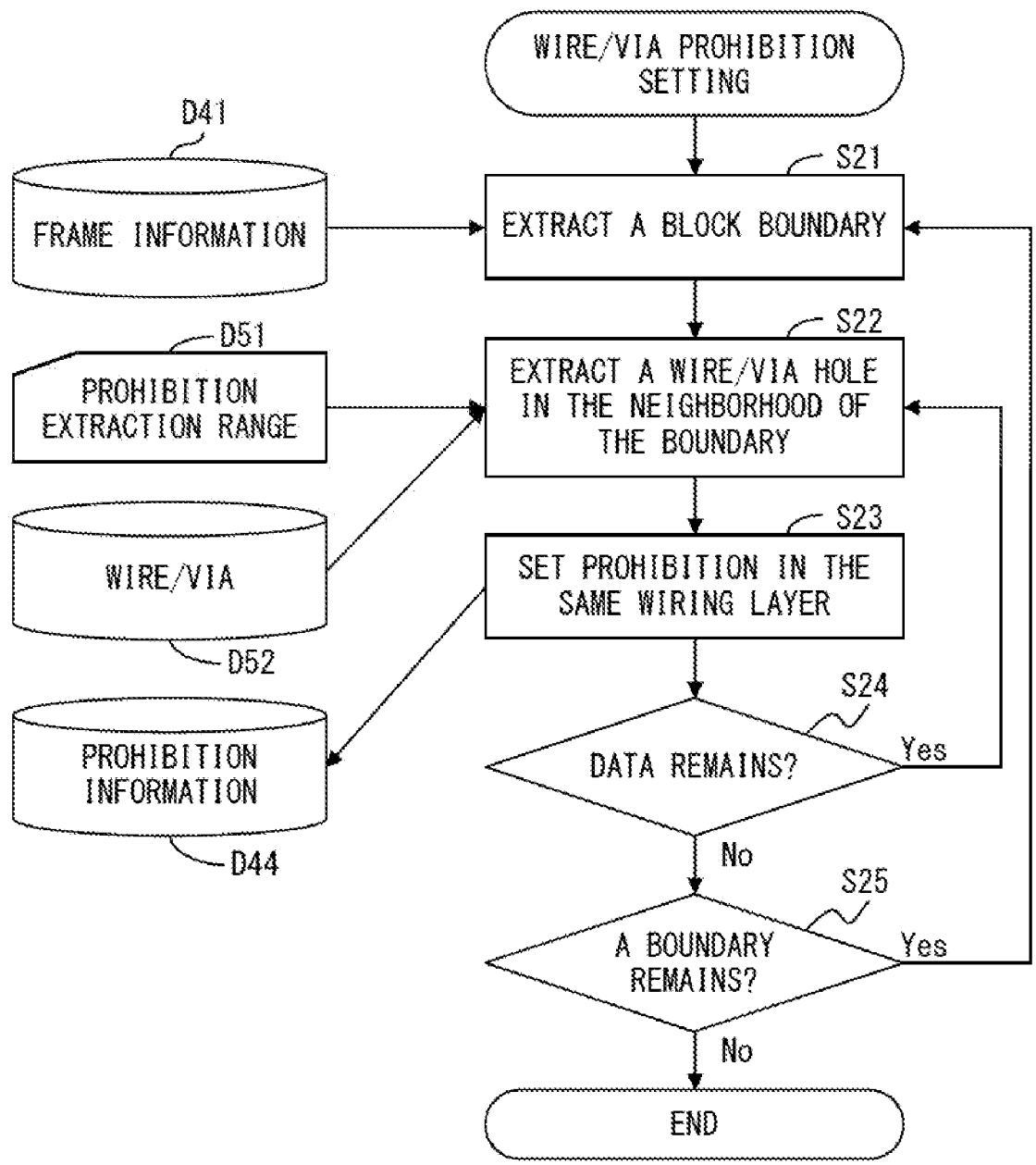
F I G. 17

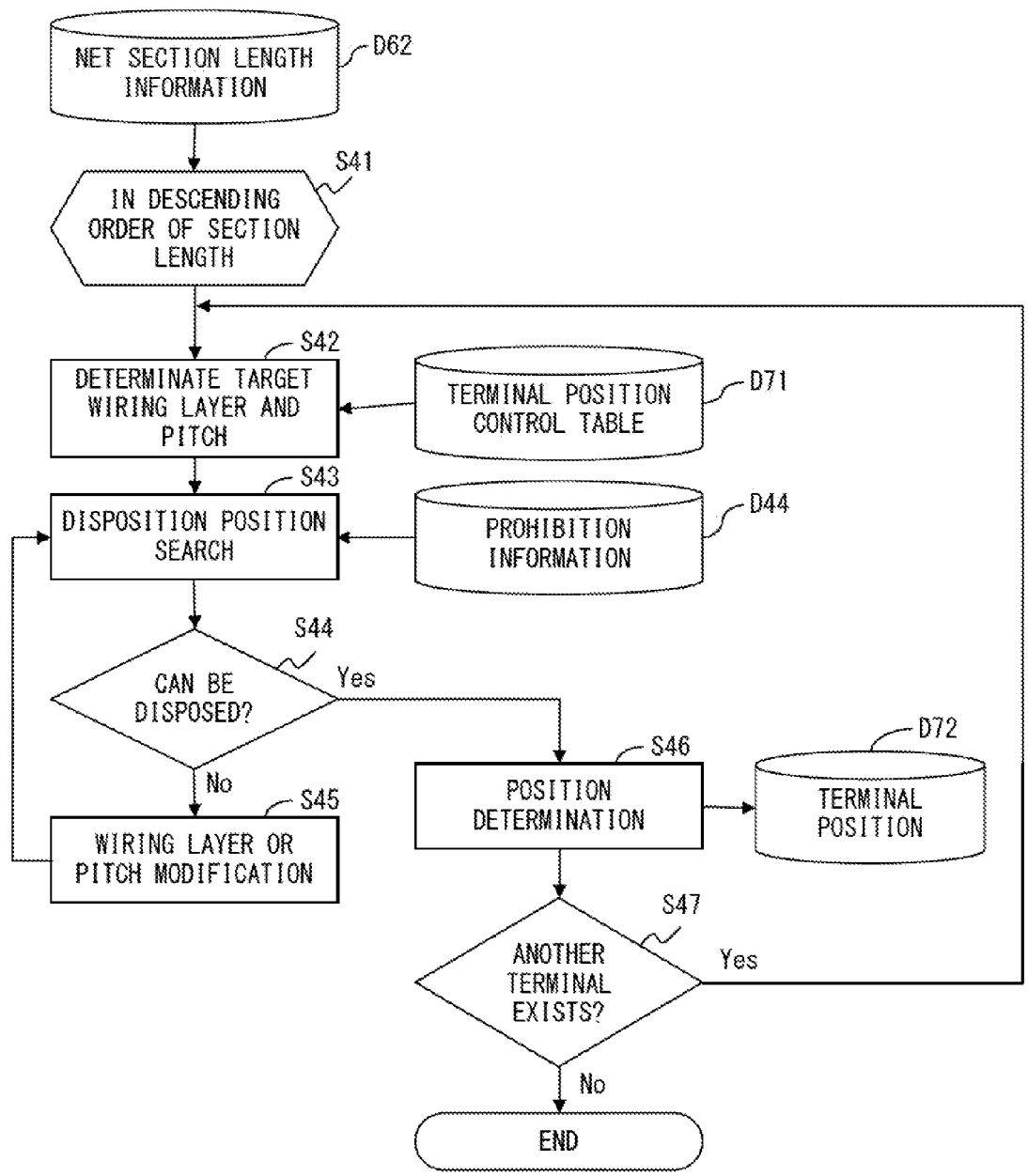
F I G. 19

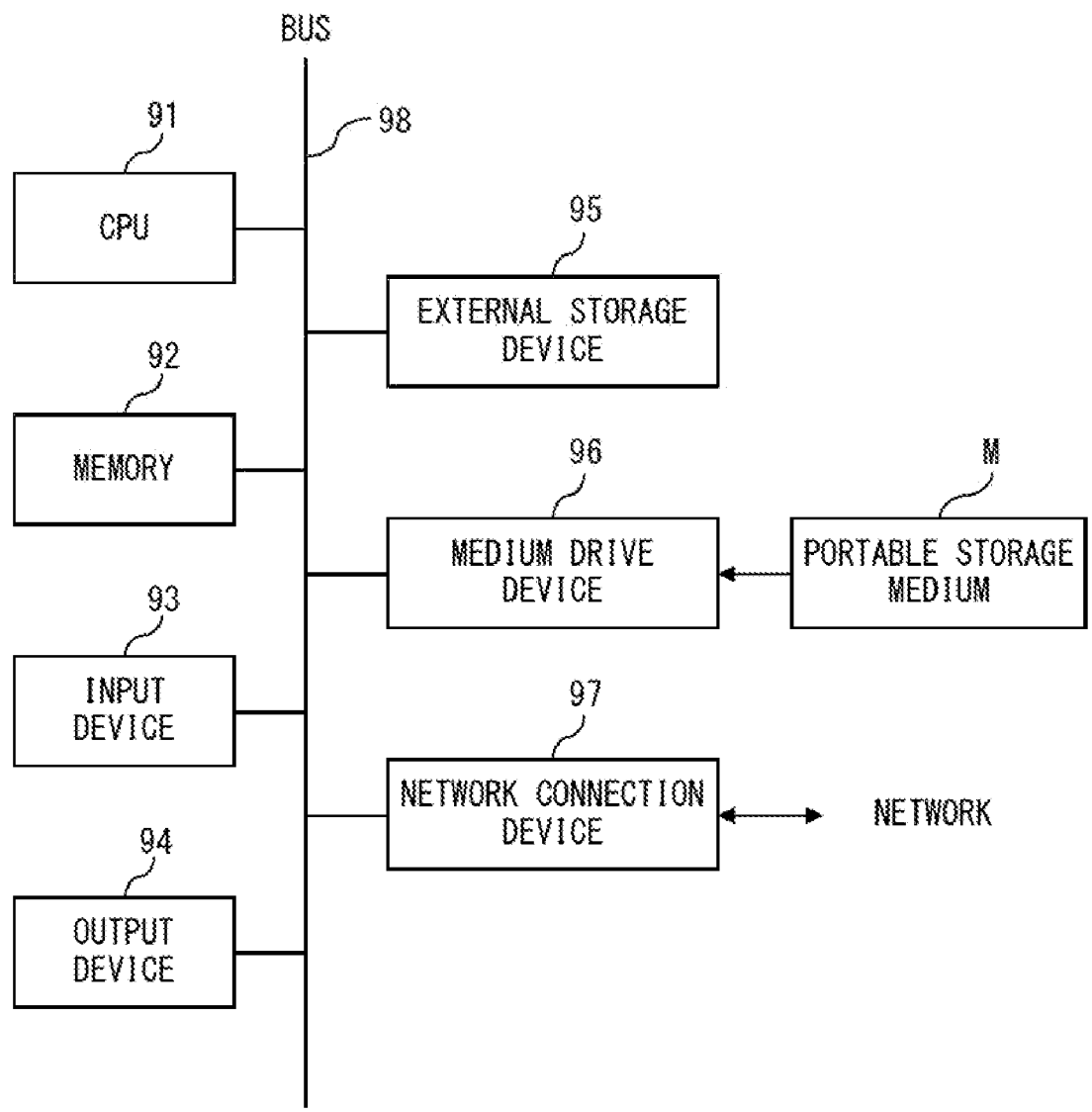
F I G. 2 0

LAYOUT DESIGN METHOD, APPARATUS AND STORAGE MEDIUM

CROSS-REFERENCE TO RELATED APPLICATION

This application is based upon and claims the benefit of priority of the prior Japanese Patent Application No. 2008-241942, filed on Sep. 22, 2008, the entire contents of which are incorporated herein by reference.

FIELD

The embodiments discussed herein are related to a layout design for determining the disposition and wiring of cells constituting a semiconductor integrated circuit.

BACKGROUND

There are many processes in the design of a semiconductor large-scale integrated circuit (LSI) needed to operate in a high frequency as in a CPU and the like. Recently, due to the fineness by the progress of a process technology and the increase of a circuit scale accompanying the fineness, it has become difficult to design the layout of the entire LSI. Therefore, in such a layout design it is common that the entire LSI is divided into a plurality of modules and a design is made in parallel for each module.

In the initial stage of the layout design, the detail of each module is not yet determined. Therefore, usually a floor plan is manually made taking a circuit scale, the rough flow of a signal and the like into consideration in advance and then the rough location and shape of each module are determined. In the floor plan, besides, the location of the external terminal of a module (module terminal) becoming the interface of the module is determined. The module terminal is used for connection of the modules or as the external terminal of a chip.

When a design method for dividing the entire LSI into modules and making their layout designs in parallel is adopted, it becomes preferable to review them in order to optimize the location of the module terminal. As the optimization method, a method for applying optimization to wiring in which there is a big difference between wire lengths calculated on the basis of a determined route and a wire length estimated from a distance between module terminals, again, a method for determining a rough route in advance and putting an actually designed route within the rough route and the like are known.

A high-speed operation and the fineness of a process give a serious influence to the wiring delay of signals. Since there is a coupling capacity being a capacity between wires caused between two parallel wires, it is known that crosstalk noise is caused by the change of signals in one wire causing an electromotive force in another wire. The crosstalk noise causes inconveniences, such as delay increase, a miss-operation and the like. Therefore, recently, even in the initial stage of a layout design, a design taking the occurrence of inconveniences into consideration has been needed.

As countermeasures against crosstalk noise, space between wires is broadened. When a wire is connected to the module terminal, it is common to modify the disposition of the module terminal.

Next, a conventional layout design support apparatus for supporting a layout design by dividing a semiconductor integrated device into a plurality of modules will be explained in detail with reference to a functional configuration illustrated in FIG. 1.

This conventional layout design supporting apparatus inputs a logically designed semiconductor integrated circuit, such as a net list, disassembles the semiconductor integrated circuit into a plurality of modules according to a floor plan and supports the detailed design for determining the disposition of cells and wiring for each module. For this purpose, the conventional layout design supporting apparatus includes a module shape determination unit 11, a rough wiring unit 12, a terminal position adjustment unit 13, a module division unit and a detailed design unit 15.

The module shape determination unit 11 makes a floor plan for determining the shape and disposition of modules dividing a semiconductor integrated circuit according to the instructions of a designer. Each module is a part of the semiconductor integrated circuit and signals determined by a logical design are transmitted/received between the modules. The signals to be transmitted/received are automatically determined accompanying the assignment of functions to the modules. The rough wiring unit 12 determines rough wiring for transmitting/receiving the signals between the modules. The terminal position adjustment unit 13 adjusts (modifies) the position of each module terminal whose disposition range is restricted by the determination of the rough wiring. The module division unit 14 divides the semiconductor integrated circuit into a plurality of modules according to the floor plan.

FIG. 1 illustrates that three pieces of module data D1 are generated by dividing the semiconductor integrated circuit into three modules. Each piece of module data D1 includes a net list for a corresponding module, disposition information indicating the disposition of each module terminal and disposition information indicating the shape and disposition of the module.

The detailed design unit 15 performs a detailed design for determining the disposition of each cell indicated by the data D1 and wiring for each module data D1. Each design result is outputted as module data D2. This data D2 is obtained, for example, by adding disposition information indicating the disposition of each cell, wire information indicating the route of each wire and the like to the module data D1. The wire information of each wire indicates the pins of each cell connected by the wire, a route between pins and the like.

FIG. 2 illustrates an example of module division. In this division example, a semiconductor integrated circuit 30 is divided into four modules 31 through 34. In FIG. 2, the module is described as a "BLOCK".

The module 32 illustrated in FIG. 2 is one whose disposition and wiring is determined. A hatched rectangle with "CL" attached and a rectangle with "ST" attached indicate a cell and a site being an area in which cells CL are collectively disposed, respectively. A solid line connecting between cells CL existing in different sites indicates wiring.

FIG. 3 illustrates another example of module division. In this division example, a semiconductor integrated circuit 40 is divided into two modules 41 through 42. In FIG. 3 too, the module is described as a "BLOCK". A solid line separating the module 41 from the module 42 indicates a boundary.

In the module 41, cells are disposed in positions fairly away from a boundary with the module 42. In the module 41, similarly cells are also disposed in positions fairly away from a boundary with the module 42. Thus, a distance between adjacent cells CL is increased in a direction orthogonal to the boundary in a shape of pinching the boundary. This is because space between cells is made a buffer area in which the wiring and the like of one module are not affected by another module.

By working out a floor plan, it can be checked whether all functions can be realized in a desired chip area. If a useless area seems to occurs, the useless area can be deleted. Thus, conventionally, in working out a floor plan, the minimization of the chip area is focused. This is because by minimizing the chip area, the number of chips collected from one semiconductor wafer can be increased and its productivity can be improved.

However, the fineness of a semiconductor integrated circuit by the progress of a process technology and the increase of a circuit scale accompanying the fineness greatly is affecting the execution of a detailed design for determining the disposition of cells and wiring. More particularly, the increase of the circuit scale is making a process time needed to execute a detailed design longer. The fineness of a process makes optimal wiring more difficult. In order to perform an optimal wiring, it is preferable to more appropriately determine the disposition of a module terminal. Therefore, it is considered that in the pre-stage of a detailed design, a design might be made taking the detailed design into consideration more.

As technical reference literature, there are Japanese Laid-open Patent Publication Nos. H8-44784, 2003-30266 and 2002-215704.

SUMMARY

One system to which the present invention is applied divides a first module obtained by dividing a semiconductor integrated circuit into a plurality of second modules in order to support a layout design for determining the disposition of each cell constituting the semiconductor integrated circuit and wiring and executes the detailed design of a layout for determining the disposition of each cell and wiring in the second module.

The number of cells to be disposed and wired in each module is reduced by the re-division into the second module. The cell means the component of a semiconductor integrated circuit and it can be also a functional block being a previous design asset.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 is a rough flow of a layout design that can be realized by applying preferred embodiment;

FIG. 7 explains how to set a boundary dividing a module into blocks;

FIG. 11 explains how to set a wiring section passing across a boundary;

FIG. 12 explains how to estimate a wire length;

FIG. 13 is an example of the contents of a terminal position control table;

FIG. 16 is a flowchart of a cell prohibition setting process;

FIG. 17 is a flowchart of a wire/via prohibition setting process;

FIG. 19 is a flowchart of a terminal position assignment process; and

FIG. 20 is an example of the hardware configuration of a computer to which the preferred embodiment can be applied.

DESCRIPTION OF EMBODIMENTS

Preferred embodiments of the present invention will be explained below with reference to accompanying drawings.

FIG. 4 is a rough flow of a layout design that can be realized by applying this preferred embodiment.

In this preferred embodiment, as illustrated in FIG. 4, a process P1 for making a floor plan for dividing a semiconductor integrated circuit into a plurality of modules, a process P2 for dividing each module divided according to the floor plan into smaller modules (hereinafter called "sub-module"), a process P3 for determining the position of a module terminal for a connection between the sub-modules, a process P4 for determining the disposition of cells for each sub-module, a process P5 for determining wiring for connecting between cells and a process P6 for generating manufacturing data for manufacturing the semiconductor integrated circuit are performed. Actually, the processes P1 through P5 are repeated in order to cope with a detected inconvenience, a design modification and the like from time to time.

The processes P4 and P5 are performed as a detailed design. In this preferred embodiment, a module obtained by a floor plan is further divided into sub-modules and a detailed design is executed. A process time needed to determine wiring increases exponentially as the number of cells (pins provided in cells) increases. Therefore, wiring can be determined for a shorter process time by dividing a module into sub-modules. The entire process time can be also widely shortened by the division of a module into sub-modules and the determination of the position of a module terminal accompanying the division. In this case, a cell means is the generic term of the component of a logically designed semiconductor integrated circuit and includes a function block (intellectual property (IP)) being a previous design asset and the like.

Figure 5:
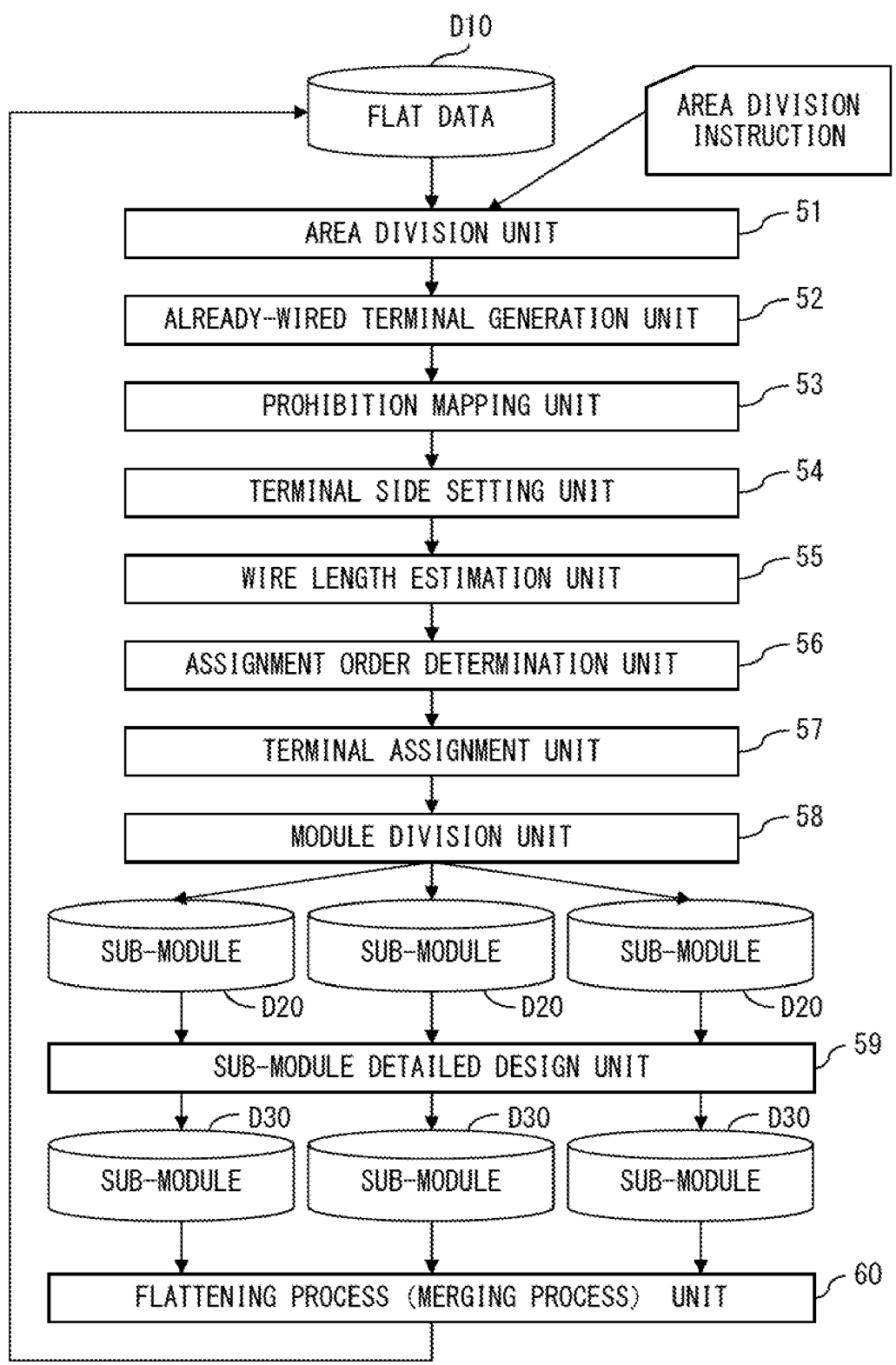
FIG. 5 is a functional configuration of a layout design support apparatus according to this preferred embodiment.

FIG. 5 is a functional configuration of a layout design support apparatus according to this preferred embodiment. This layout design support apparatus (hereinafter called "support apparatus") is realized as a apparatus for supporting a layout design targeting a module obtained as a result of a floor plan, namely, by dividing a logically designed semiconductor integrated circuit (LSI). In order to support the layout design the support apparatus includes an area division unit 51, an already-wired terminal generation unit 52, a prohibition mapping unit 53, a terminal side setting unit 54, a wire length estimation unit 55, an assignment order determination unit 56, a terminal assignment unit 57, a module division unit 58, a sub-module detailed design unit 59 and a flattening process unit 60.

Figure 1:
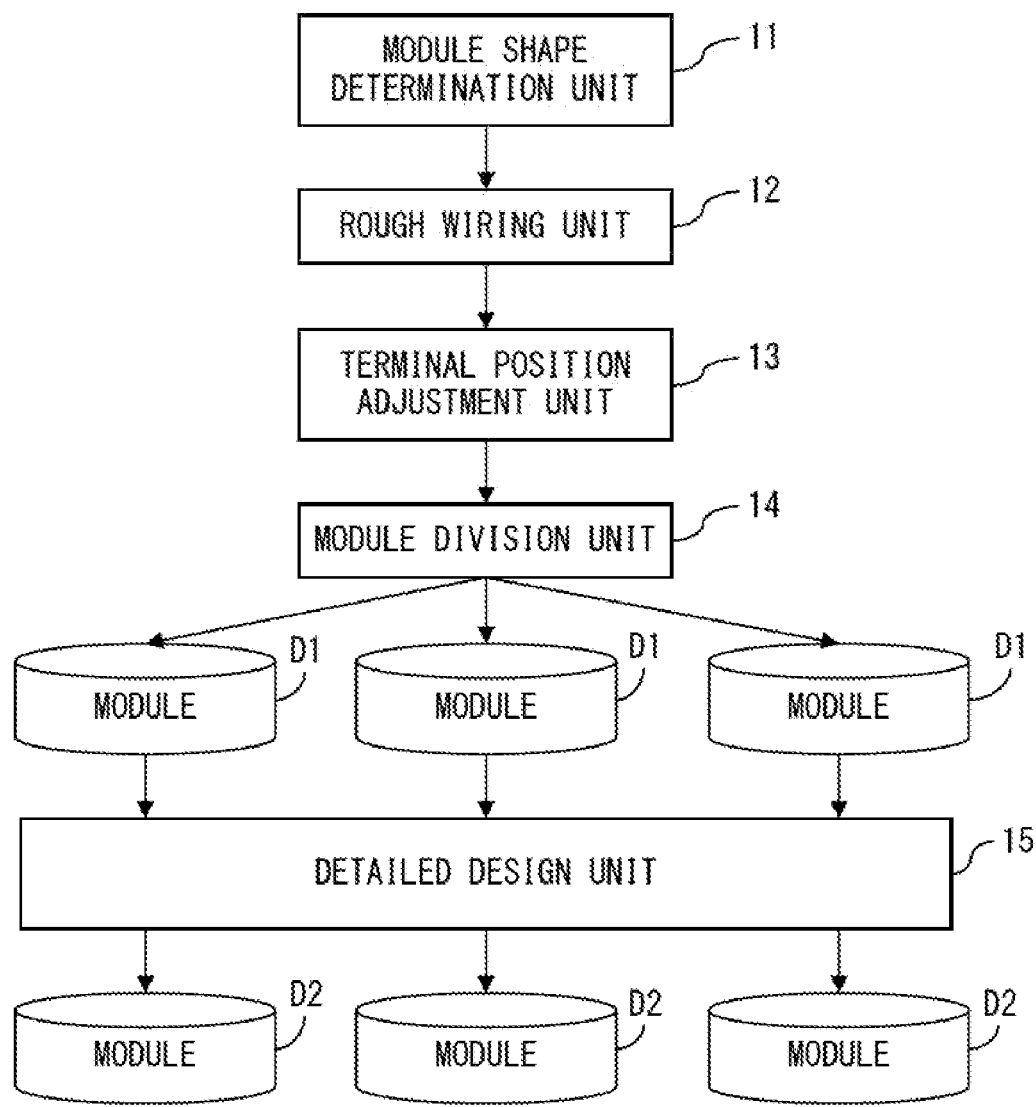
FIG. 1 is a functional configuration of the conventional layout design support apparatus.
Figure 2:
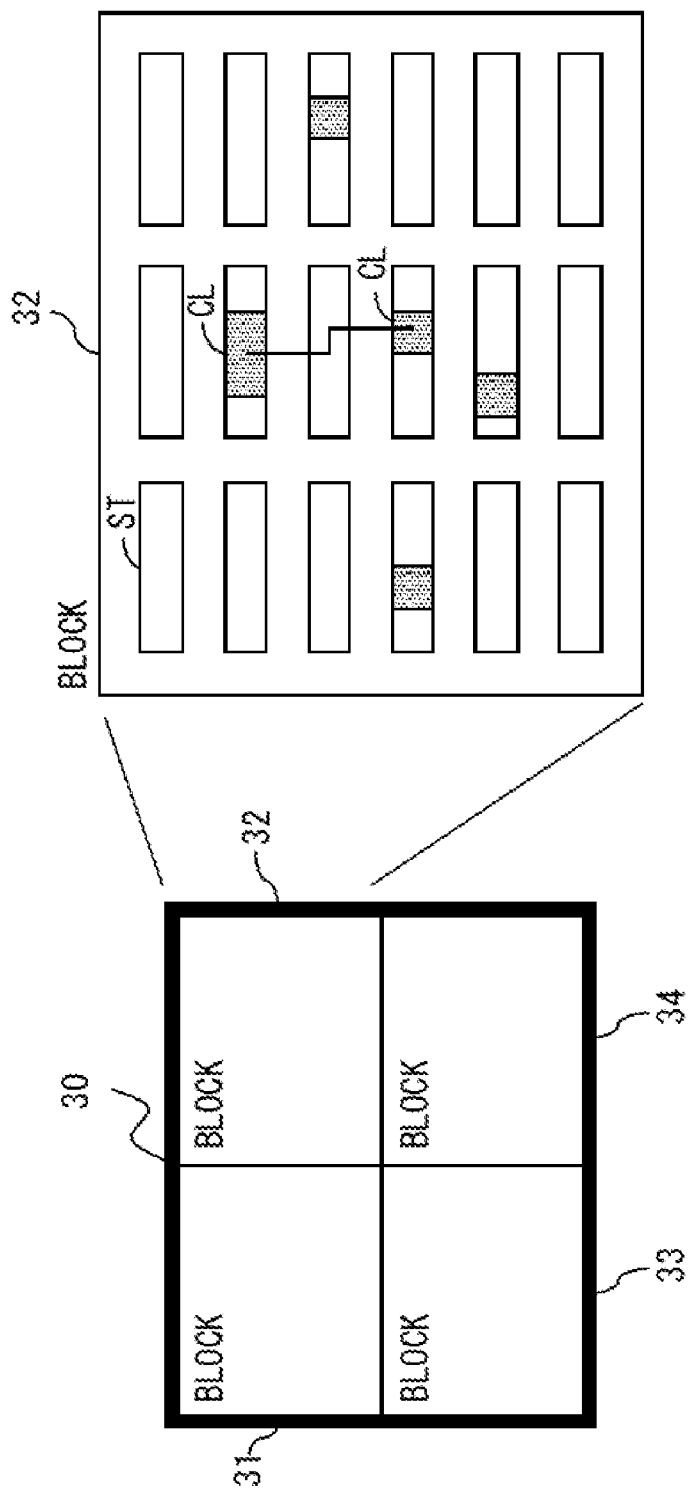
FIG. 2 is an example of module division.

Flat data D10 illustrated in FIG. 5 is for one module and corresponds to, for example, one of the three pieces of module data D1 illustrated in FIG. 1. The area division unit 51 further divides a module indicated by the flat data D10 into a plurality of smaller sub-modules according to the instruction of a designer. In this example the further divided sub-module is called as "block".

Figure 6:
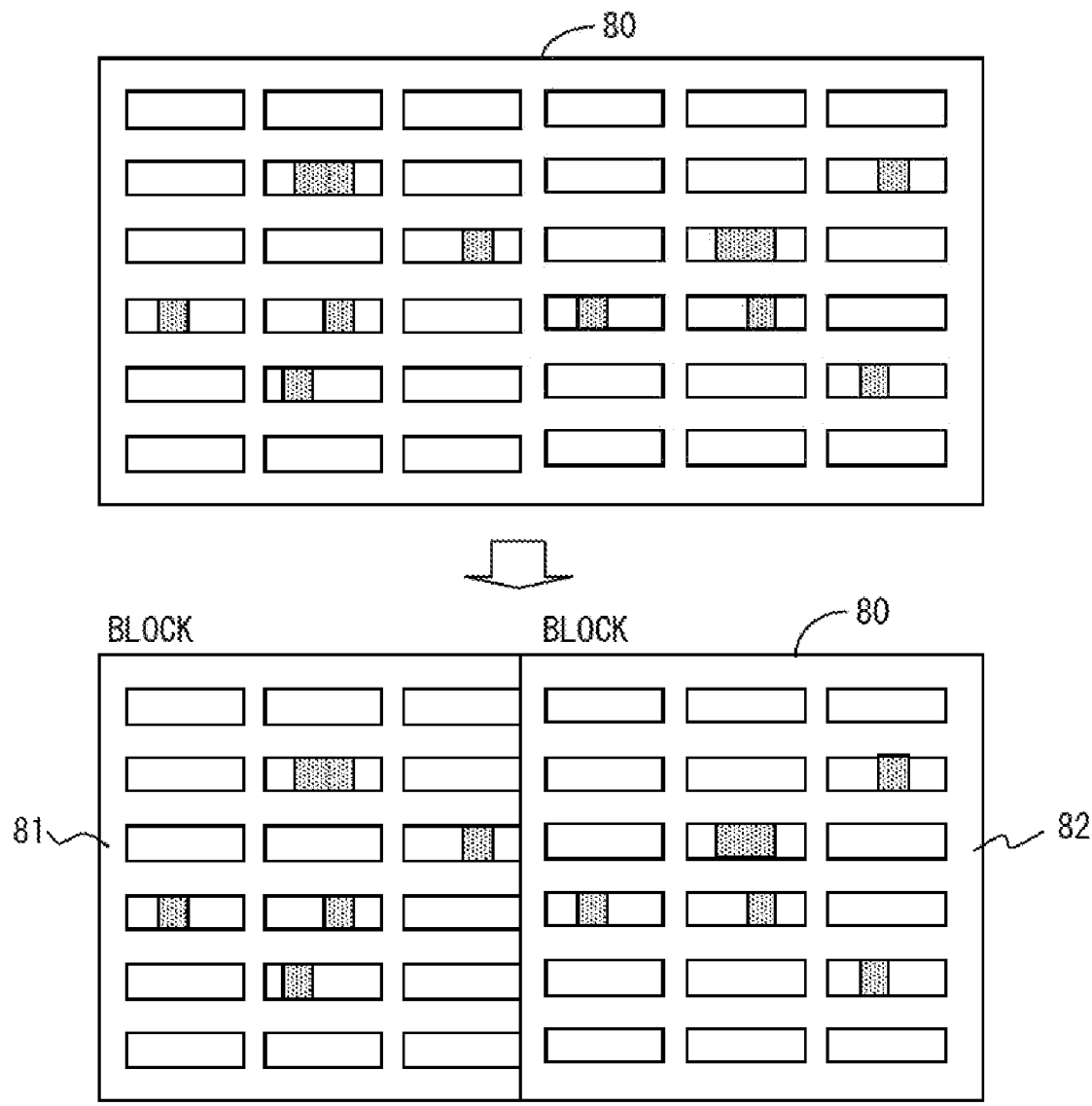
FIG. 6 explains how to divide a module.

FIG. 6 explains how to divide a module. In the example illustrated in FIG. 6, a module 80 is divided into two blocks 81 and 82.

FIG. 7 explains how to set a boundary dividing a module into blocks. "+" illustrated in FIG. 7 indicates a grid point becoming a basic unit indicating the disposition and the minimum pitch space of the wiring. On the left and right sides of FIG. 7, the conventional boundary setting method and the boundary setting method in this preferred embodiment, respectively, are illustrated.

Conventionally, as illustrated on the left side of FIG. 7, a boundary line BL1 indicating a boundary is set by a straight line passing through adjacent grid points, while in this preferred embodiment, a straight line not passing through adjacent grid points is also handled as a boundary line. Therefore, the position of the boundary line in the lateral direction is between adjacent grid points. It is for the following reasons to set a boundary between grid points.

Figure 3:
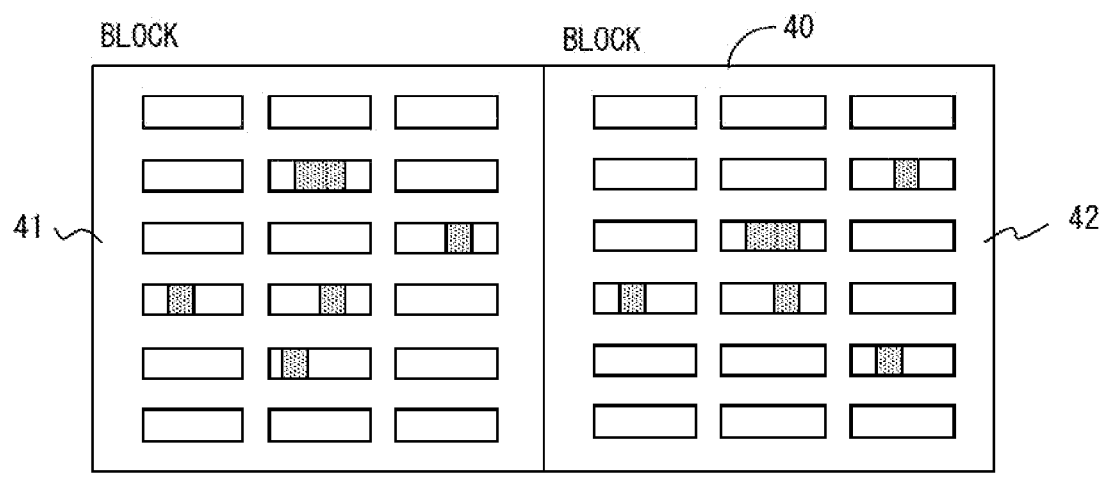
FIG. 3 is another example of module division.

Since a grid point is the basic unit of wiring, a route is determined as the combination of straight lines passing through adjacent grid points. Therefore, if a boundary is set by only straight lines passing through adjacent grid points, the number of grid points that can be uses for a route decreases. The decrease of the number of grid points can be avoided by newly providing a buffer area, as illustrated in FIG. 3, namely, by adding grid points for a buffer area. However, the new provision of a buffer area means that the result of a floor plan cannot be used without modifications. Therefore, the expression or management of data becomes complicated.

If a boundary is set between adjacent grid points, the occurrence itself of a grid point that cannot be used for a route can be avoided. In this case, a floor plan can be used without modifications. Therefore, a boundary is set adjacent grid points.

On the right side of FIG. 7, a part extending in the lateral direction of a boundary line BL2 becomes a straight line passing between adjacent grid points. This is because a designer has determined that there is no need to set a boundary between adjacent grid points on the basis of one block whose part is a boundary or two blocks contacting on the boundary. Whether a boundary to be set between adjacent grid points can be individually determined dividing the boundary into a plurality of parts. Hereinafter, data indicating a set boundary is called "boundary data" and the collection of a plurality of pieces of such boundary data is generally called "frame information".

In this preferred embodiment, a module is hierarchically structured by further dividing it into blocks (sub-modules). The hierarchical structure is cancelled by merging the divided blocks and data is made flat. Such flat data can be hierarchically structured again by the area division unit 51. This is the reason why data inputted to the area division unit 51 is made flat data D10.

The flat data D10 usually includes wiring data indicating already determined wiring (previous wiring determined by rough design or detailed design). The already-wired terminal generation unit 52 extracts a section of wire information (NET) passing across a set boundary for block division and makes a terminal of the section. The terminal is formed according to the selection of a designer.

Figure 8:
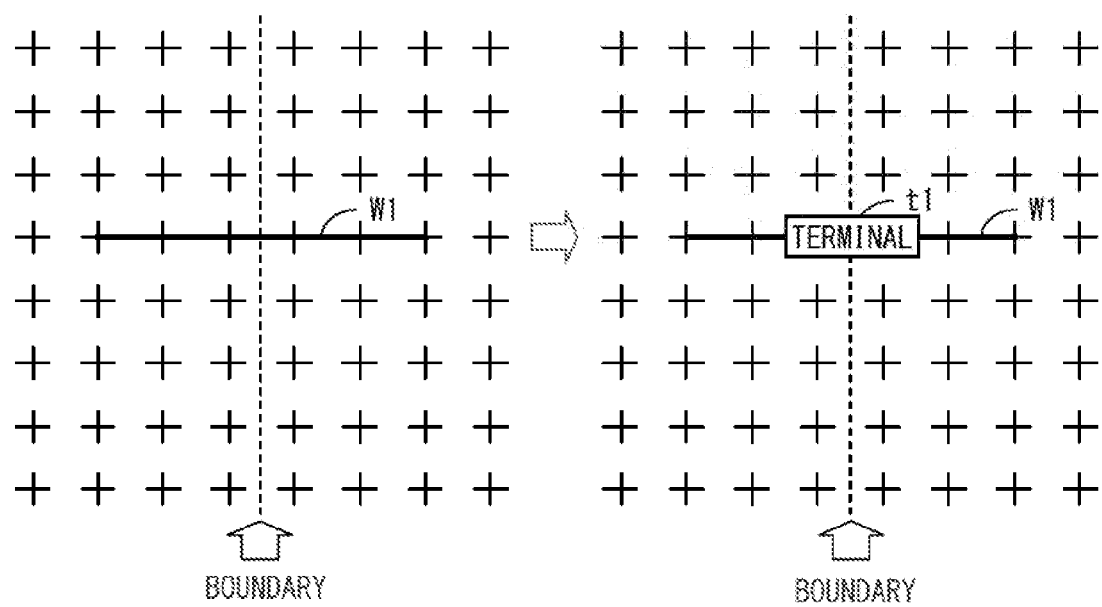
FIG. 8 explains a block (module) terminal disposed for a connection between blocks.

FIG. 8 explains a block (module) terminal disposed for a connection between blocks. W1 and t1 are a wire passing across a boundary between blocks and a block terminal disposed on the boundary in the wire W1.

Width in a direction orthogonal to the boundary line of the block terminal t1 is made a distance between grid points nearest to respective boundary lines in two blocks. Thus, even when wiring cannot be handled by only a grid point-based coordinates, a block terminal connecting between blocks can be disposed on a boundary while a connection by wiring passing across a boundary is secured. Therefore, the terminal formation targets between adjacent grid points pinching a boundary line in a direction orthogonal to the boundary line.

Width in a direction parallel to a boundary line is the same as that of the wire W1, although a terminal part is enlarged in FIG. 8 for the purpose of explaining a block terminal.

The prohibition mapping unit 53 maps a wiring-prohibited range on a boundary in a direction along a boundary line in order to avoid the occurrence of design rule violation. More particularly, in a place where there is a fairly high possibility that design rule violation, such as short, spacing violation or the like in the stage of a detailed design for determining wiring, the disposition of a block terminal is prohibited by the disposition of a mask pattern indicating a wiring-prohibited range or the like. Thus, a detailed design can be made more appropriately. This brings effects that the repeated number of designs decreases, a stage (process) in which a design is repeated is delayed up to later and so on. The collection of a plurality of pieces of prohibited range data indicating a mapped wiring-prohibited range on a boundary is generally called "prohibition information" hereinafter.

Figure 9:
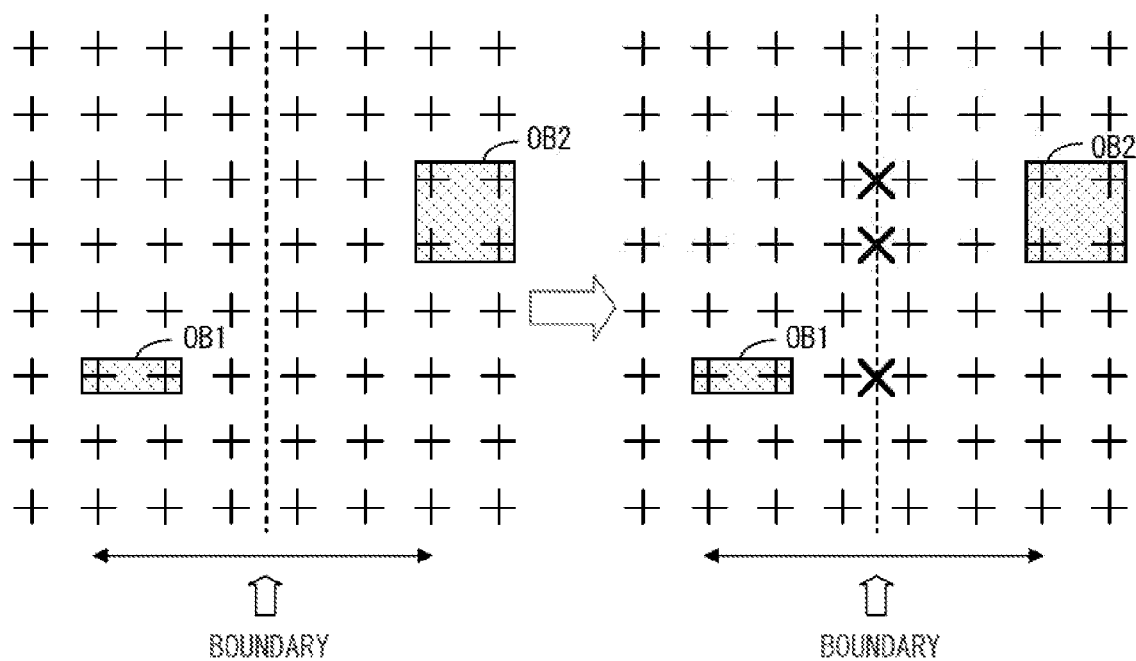
FIG. 9 explains a mapped disposition-prohibited range (No. 1)
Figure 10:
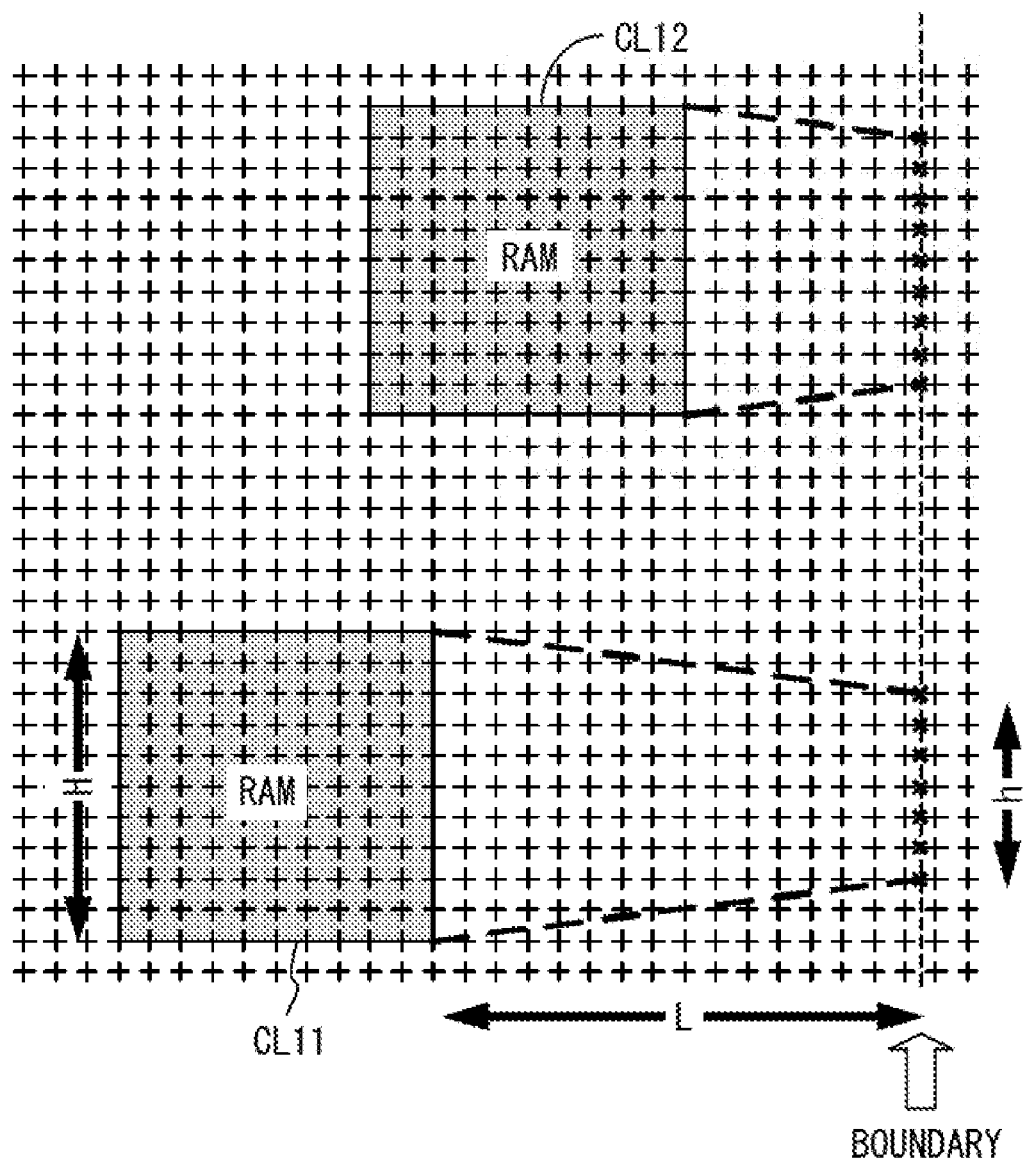
FIG. 10 explains a mapped disposition-prohibited range (No. 2)

FIGS. 9 and 10 explain a mapped disposition-prohibited range. FIG. 9 indicates a disposition-prohibited range mapped by obstacles (objects) OB1 and OB2 existing within a certain range and FIG. 10 indicates a disposition-prohibited range mapped by a large-scale cells CL11 and CL12, such as RAM or the like, existing in the neighborhood in a direction orthogonal to a boundary. In FIGS. 9 and 10, the disposition-prohibited range is indicated by "x".

Figure 15:
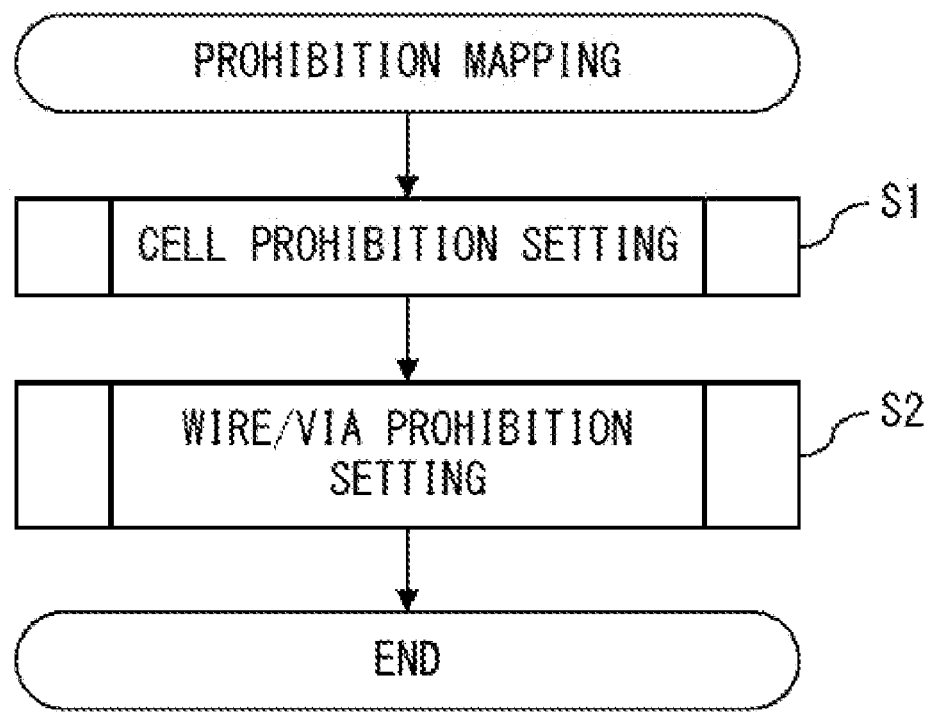
FIG. 15 is a flowchart of a prohibition mapping process.

FIG. 15 is a flowchart of a prohibition mapping process. The prohibition mapping unit 53 can be realized by a computer executing this process. Next, the prohibition mapping process will be explained in detail with reference to FIG. 15.

Firstly, in step S1 a cell prohibition setting process for mapping a disposition-prohibited range by an obstacle or a cell including a circuit cell, such as an AND (logical product) gate or the like or a micro-cell, such as RAM or the like existing in the neighborhood of a boundary is performed. Then, in step S2 a wire/via-prohibition setting process for mapping a disposition-prohibited range by a wire or a via hole connecting between wiring layers existing within a certain range from a boundary is performed. After the execution, this prohibition mapping process is terminated.

FIG. 16 is a flowchart of a cell prohibition setting process executed in step S1. Next, a cell prohibition setting process executed as a sub-routine process in the prohibition mapping process will be explained in detail with reference to FIG. 16.

This setting process is executed referring to cell extraction range information D42 indicating the conditions of a cell in which a disposition-prohibited range to be set by a distance from a boundary and cell information D43 indicating the disposition (coordinates) and a layer in which wiring is prohibited of each cell besides the above-described frame information D41. The disposition-prohibited range is, for example, expressed by a coordinates range and a layer to which the coordinates range is applied. A disposition-prohibited range expressed thus, that is, a prohibited range data is stored as prohibition information D44.

Firstly, in step S11 a boundary between blocks is extracted referring to the frame information D41. The boundary extracted in this case is, for example, a part (boundary line)

expressed by one straight line. Then, in step S12a cell in which a disposition-prohibited range is set on the extracted boundary referring to the cell extraction range information D42 and the cell information D43. After the extraction, the process advances to step S13.

In step S13 it is determined which the range in a direction along the boundary of the extracted cell is prohibited, entirely or partially. This can be determined, for example, by preparing area information indicating a range in which wiring to be prohibited in a direction along the boundary in the cell information D43, a library or the like, for each cell. If the area information of the extracted cell does not indicate a range in which wiring is prohibited, it is determined no and the process advances to step S16. If the area information of the extracted cell indicates a range in which wiring is prohibited, it is determined yes and the process advances to step S14.

In the extraction of a cell, sometimes a target cell cannot be extracted. In that case, the process advances from step S12 to step S17.

In step S14 a distance between a boundary and a cell is calculated. This distance corresponds to the distance L illustrated in FIG. 10. After the calculation of the distance L, the process advances to step S15 and calculates a wiring prohibited range on the boundary. If a wiring-prohibited range and a range indicated by the area information are assumed to be h and H, respectively, the wiring-prohibited range is calculated as follows.

$$h = H - \alpha \times L \quad (1)$$

where, $\alpha$ is a constant of less than 1 and when the calculation result becomes negative, it is made 0. Thus, a wiring-prohibited range h is made to become narrower as a cell gets farther away from a boundary. The wiring-prohibited range h is stored as prohibition information D44 together with a layer in which an extracted boundary exists. After the storage, the process advances to step S16.

In step S16 it is determined whether there is another cell to which a wiring-prohibited range h is set. If there is another target cell, it is determined yes and the process returns to step S12. In step S12 a subsequent target cell is extracted. If there is no other cell, it is determined no and the process advances to step S17.

In step S17 it is determined whether there is another target boundary. If there is another target boundary, it is determined yes and the process returns to step S11. In step S11 a subsequent target boundary is extracted. If there is no other target boundary, it is determined no and the cell prohibition setting process is terminated here.

FIG. 17 is a flowchart of a wire/via prohibition setting process executed in step S2 in the prohibition mapping process illustrated in FIG. 15. Next, the wire/via prohibition setting process will be explained in detail with reference to FIG. 17. A wire or a via hole is handled as an obstacle as illustrated in FIG. 9. The obstacle can be others than a wire, a via hole and the like.

This setting process is executed referring to prohibition extraction range information D51 indicating the condition of an obstacle (in this case, a wire or a via hole) to which a disposition prohibition range is set by a distance from a boundary and wire/via information D52 indicating a Shape, disposition (coordinates), and formed layer for each via hole besides the above-described frame information D41. The disposition prohibition range is stored as prohibition information D44.

Firstly, in step S21 the boundary of a block is extracted referring to frame information D41. Then, in step S22, a wire or a via hole to which a disposition-prohibited range is set on the extracted boundary is extracted referring to prohibition extraction range information D51 and wire/via information D52. After the extraction, the process advances to step S23. In step S23 a range in a direction along the boundary of the extracted wire or via hole is specified as a wiring prohibited range and is stored together with a layer from which the boundary is extracted as prohibition information D44. After the storage, the process advances to step S24.

In the extraction of an obstacle, sometimes a target obstacle cannot be extracted, as in the case of a cell. In that case, the process advances from step S22 to step S25, which is not especially illustrated in FIG. 17.

In step S24 it is determined whether there is another target wire or via hole. If there is no target among the wires and via holes indicated by the wire/via information D52, it is determined no and the process advances to step S25. If there is another target wire or via hole, it is determined yes and the process returns to step S22. In step S22 a subsequent target wire or via hole is extracted.

In step S25 it is determined whether there is a target boundary (boundary line). If there is a target boundary, it is determined yes and the process returns to step S21. In step S21, a subsequent target boundary is extracted. If there is no target boundary, it is determined no and the wire/via prohibition setting process is terminated here.

Thus, a range prohibiting wiring on a boundary between blocks is automatically set and is stored as prohibition information D44. By using this prohibition information D44 for a wiring design, more appropriate wiring can be determined.

The terminal side setting unit 54 determines the disposition of block terminals connecting between blocks, namely sets a wiring section passing across a boundary in order to connect between cells.

The wiring section is set by extracting the output pin of a cell which outputs signals the cell of another block into a focused block. If there is no such output pin, the input pin of a cell which inputs signals outputted from the cell of another block is extracted. In the disposition of block terminals, in order to minimize wiring delay, a pin whose wire length is estimated to be short in a group comprising of one or more pins obtained such extraction is set with priority. As to the target position of a block terminal, a rectangle connecting two pins is assumed and it is set to a part in which the rectangle intersects with a boundary. If there is a plurality of boundary parts intersecting with the rectangle, one having the greater degree of freedom is selected and is set. The wire length can be also estimated by assuming such a rectangle.

FIG. 11 explains how to set a wiring section passing across a boundary. In the example illustrated in FIG. 11, a module 1100 is divided into blocks 1101 and 1102. In the block 1101, two cells CL21 and CL22 are disposed and in the block 1102, two cells CL31 and CL32 are disposed. The above-described position setting of a block terminal will be explained in detail below with reference to FIG. 11. In this example it is assumed that the output pin Aa of the cell CL21 is connected to the input pin Bc of the cell CL32 in the block 1102 and the input pin Ab of the cell CL22 is connected to the input pin Bd of the cell CL32 in the block 1102. Namely, it is assumed that two wires are provided between the blocks 1101 and 1102. It is assumed that the respective cells CL21, CL22, CL31 and CL32 are disposed as illustrated in FIG. 11. A description "LSG" in FIG. 11 is the abbreviation of a layout sub-group.

In the two wires illustrated in FIG. 11, a wire length between the pins Aa and Bc is shorter than a wire length between the pins Ab and Bd. Therefore, in the case of two wires, priority is given to between the pins Aa and Bc and the target position of a block terminal is set.

A rectangle connecting the pins Aa and Bc is illustrated on the right side of FIG. 11. The boundary part indicated by the rectangle is set as the target position of a block terminal.

However, a rectangle connecting the pins Ab and Bd intersects with a boundary indicated by two straight lines. Therefore, one having the greater degree of freedom is selected from the two boundary parts which intersect with the rectangle.

The degree of freedom is determined focusing on, for example, the length of a boundary part or the number of usable grid points in a route passing across a boundary part. Thus, one whose boundary part is longer or whose number of grid points is larger is regarded as one having the high degree of freedom and the target position of a block terminal is set to it. Since on this moment there is the target position of another block terminal, it is set excluding an existing target position.

The wire length estimation unit 55 calculates an estimated wire length using setting result of the target position of a block terminal. The estimation method of wire length will be explained in detail with reference to FIG. 12.

In order to reduce wiring delay, a wire is made the shortest. In other words, it is preferable to avoid a useless detour. When crosstalk noise is taken into consideration, it is preferable to shorten the length of a part in which two wires are parallel or to increase a distance between wires as the part becomes longer. Therefore, in this preferred embodiment, a rectangle connecting two pins is assumed, and the length Lv of a part in which the rectangle intersects with a boundary and length Lh in a direction orthogonal to a boundary are focused. When the length Lv is pretty short, there is a high possibility that a detour occurs unless priority is given to the setting of the target position of a block terminal. Conversely, when the length Lv is long, there is a low possibility a detour occurs. Therefore, there is a low possibility that the low priority of the setting becomes inconvenient. Thus, by taking the length Lv into consideration, the shortest route can be secured, namely, a detour can be suppressed.

However, the longer is the length of a parallel part and the narrower is the space, the greater becomes the influence of noise (crosstalk noise) caused between two parallel wires. The noise or the increase of delay due to the noise causes an error. Therefore, the length Lh is used an index indicating a possibility that such an error occurs. Thus, the wire length estimation unit 55 calculates lengths Lv and Lh for each wire passing across a boundary. These lengths Lv and Lh are generally termed as "section length" hereinafter.

Figure 18:
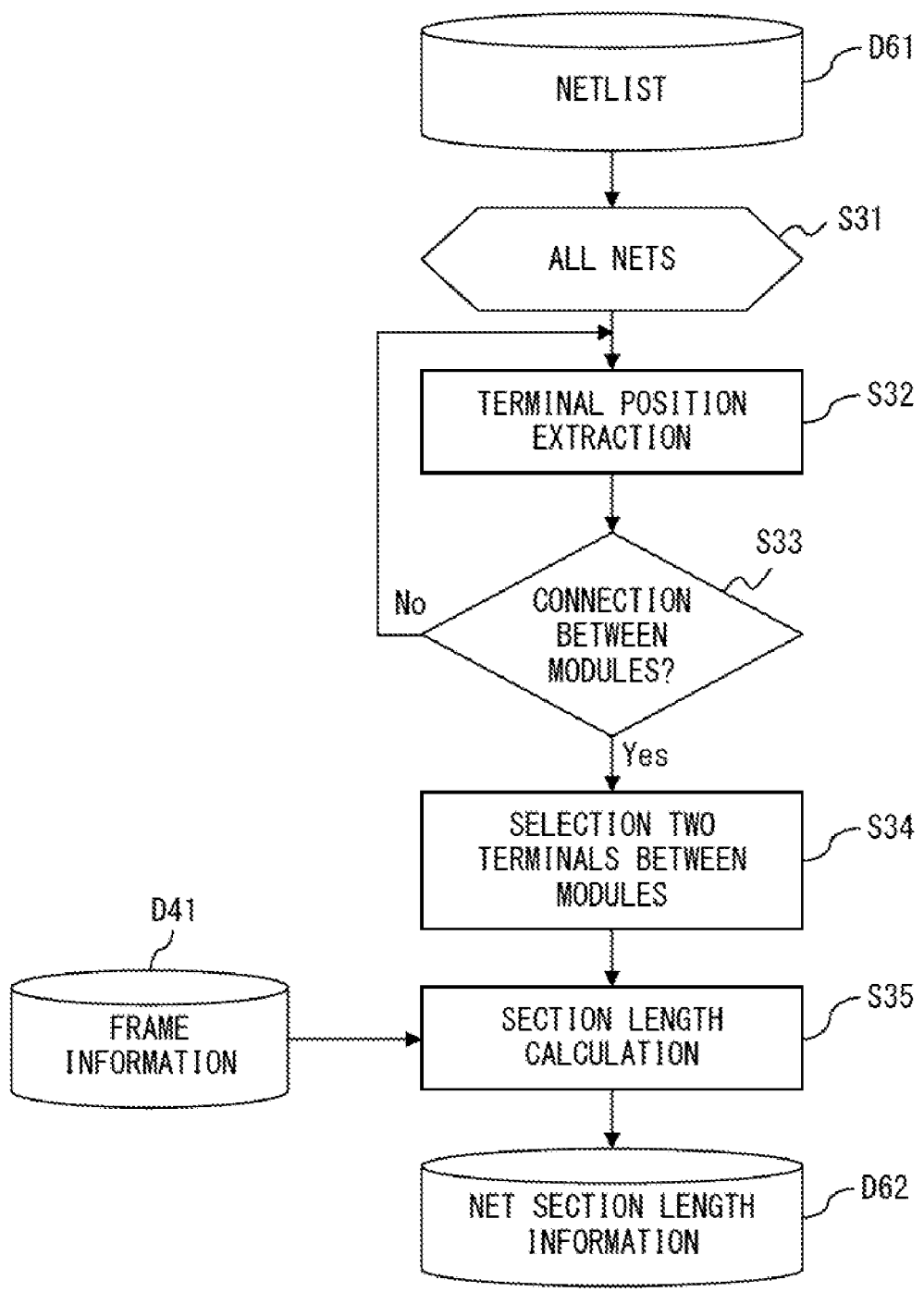
FIG. 18 is a flowchart of a net section length calculation process.

FIG. 18 is a flowchart of a net section length calculation process executed in order to calculate the above-described length Lv and Lh, that is, section length. The calculation process will be explained in detail with reference to FIG. 18.

This calculation process is executed referring to cell the information D43 besides a net list D61. 18 and the frame information D41 illustrated in FIG. In this net list D61, for example, block division is reflected. In FIG. 18 a process executed in order to calculate one section length is extracted and illustrated.

Firstly, in step S31 all wires (nets) are extracted referring to the net list D61 and are sorted for each block, for example, referring to the frame information D41. Then, in step S32 the pin of a cell connected by a wire (described as a "terminal" in FIG. 18 is selected and the position of the pin is extracted. The position is extracted referring to, for example, the cell information D43 and a library storing the information of the physical shape of each cell. After the extraction of the position the process advances to step S33.

In step S33 it is determined whether the pin whose position is extracted is connected to the pin of a cell in another block. If it is confirmed according to the net list D61 that the pin is connected to the pin of a cell existing in another block, it is determined yes and the process advances to step S34. If it is confirmed that the pin is connected to the pin of a cell in the same block, it is determined no and the process returns to step S32. In step S32 another wire is selected and the position of a pin connected by the wire is extracted.

When the process returns to step S32 from step S33, another target wire cannot always be selected. Therefore, in step S32 if there remains no other target wire, the section length calculation process is terminated, which is not especially illustrated in FIG. 18.

In step S34 another pin connected by a wire (described as a "terminal" in FIG. 18) is selected. In step S35 a rectangle connecting two pins is assumed, lengths Lv and Lh are calculated as section length on the basis of the rectangle, referring to the frame information D41 and the calculated section length is stored as net section length information D62 together with wire information indicating wiring. By the storage a series of processes for calculating one section length is terminated. Actually, after storing the section length, it is determined whether there is another target wire. If there is another target wire, it is determined yes, the process returns to step S32. Conversely if there is no other target wire, it is determined no, the net section length calculation process is terminated here.

The assignment order determination unit 56 determines the process order of block terminals on the basis of the length LV and Lh calculated as its section length by the wire length estimation unit 55. Since one processed before assigns a target position with priority, the determination of process order corresponds to the setting of priority.

The shorter is the length Lv and the longer is the length Lh, the earlier becomes the process order. These two lengths Lv and Lh both are important indexes for determining the process order. Therefore, using a table defining priority for each combination of the lengths Lv and Lh, a table defining a range in which one of the lengths Lv and Lh is focused or an equation for calculating priority using those lengths Lv and Lh is prepared and the process order is determined using such a table or an equation.

The terminal assignment unit 57 disposes block terminals on a block boundary according to the process order determined by the assignment order determination unit 56. In this preferred embodiment, a layer (wiring layer) whose target is the laying of a wire of the length Lh calculated by the wire length estimation unit 55 and an assignment pitch being space whose target is the laying of wires in the neighborhood are determined referring to a terminal position control table illustrated in FIG. 13 and places in which block terminals can be disposed are selected.

In the terminal position control table, as illustrated in FIG. 13, wire layers which are the target of wiring (the disposition of block terminals) and assignment pitch are defined for each (range of) wire length. The range of wire length and the assignment pitch are defined by values expressed by the number of grid points. The wiring layer is expressed by L1 through 8. The figure following L is larger as the higher layer located in the more upper part. The assignment pitch assumes wires whose length ranges are the same. Between wires whose lengths (length Lv) are different, the assignment pitch of one of the smaller wire length is applied. For example, between a wire whose length exceeds 1001 grids and a wire of length in the range of 501 through 1000, three grids are applied as assignment pitch. This is because the degree of a noise influence varies depending on the length of a parallel part. Since larger assignment pitch is needed as the length of the parallel part increases, the terminal position control table can control the disposition position of a block terminal in such a way not to cause an error.

Figure 14:
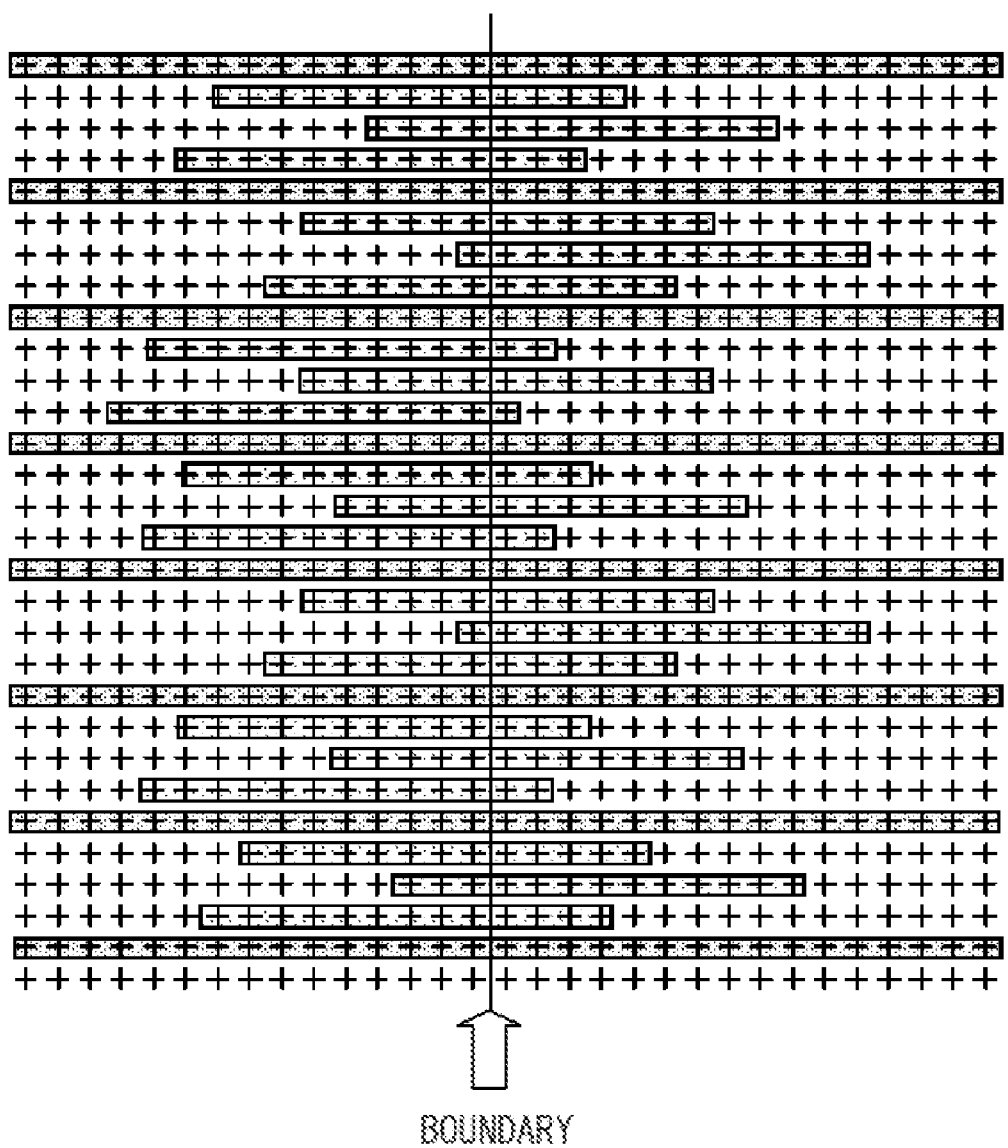
FIG. 14 is a disposition example of block terminals.

The longer is wire length as wiring on the more higher layer the terminal position control table requires. This is because generally the layer is located in the upper part more, and the wiring delay becomes small.

a. FIG. 14 is a disposition example of block terminals. In FIG. 14, any hatched rectangle indicates wiring in the same layer.

As described above, the longer is length Lh, the higher priority is assigned. Therefore, a disposition position is assigned in descending order of wire length. Thus, a wire of longer length is disposed in large assign pitch and a wire of short length is assigned to a free space. As a result, even in a state where wires crossing a boundary are disposed in high density, as illustrated in FIG. 14, disposition in which wiring delay and the length of a parallel part are optimized can be obtained.

FIG. 19 is a flowchart of a terminal position assignment process. This assignment process is used to determine the process order of wires (block terminals) and to assign the disposition position of a block terminal. The assignment order determination unit 56 and the terminal assignment unit 57 can be realized by executing this assignment process. Next, this assignment process will be explained in detail with reference to FIG. 19.

Firstly, in step S41 net section length information D62 is referenced and process order is determined, for example, by sorting wire information (block terminals) in descending order of section length. The process order depends on how to calculate priority on the basis of the section length. However, it can be also determined, for example, by giving top priority to one whose length Lv is equal to or less than a prescribed value and giving the higher priority to one whose length Lv is larger than a prescribed value as the length Lv increases. After the determining process order, the process advances to step S42.

In step S42 wire information (block block) to be processed is selected according to the order process and determines target wiring layer and assignment pitch are determined referring to a terminal position control table D71. Then, in step S43 a place in which block terminal can be disposed in the determined wiring layer with the determined assignment pitch is searched. Then, in step S44 it is determined whether it can be disposed in the target wiring layer. If there is a free space in the wiring layer and assignment pitch appropriate in the place can be secured, it is determined yes and the process advances to step S46. If there is no free space in a target wiring layer or appropriate assignment pitch cannot be secured, it is determined no and in step S45 the target wiring layer is modified. Then, the process returns to step S43 and search is applied to the wiring layer after modification.

In step S46 the position of a block terminal is determined on the basis of the searched place and is stored, for example, together with as terminal position information D72. Then, in step S47 it is determined whether there is another block terminal whose disposition position to be determined. If there is one not processed yet in the wire information sorted in step S41, it is determined yes and the process returns to step S42. The processes in step S42 and after are executed similarly. If there remains none not processed yet in the sorted wire information, it is determined no and the terminal position assignment process is terminated here.

The module division unit 58 divides flat data D10 according to its block division and generates sub-module data D20 together with the frame information D41, the cell information D43, the prohibition information D44, the wire/via information D52, the terminal position information D72 and the like. In FIG. 5 three pieces of sub-module data D20 are generated in total.

The sub-module detailed design unit 59 performs a detailed design for determining the disposition of each cell and each wiring for each piece of sub-module data D20. The position applied a block terminal is reflected in the determination of wiring.

The amount of data of sub-module data D20 used for a detailed design is reduced to widely smaller than the flat data D10 by block division. Time needed to determine wiring increases exponential-functionally according to the number of wires. Therefore, the entire time preferable for such a detailed design is shortened compared with a time preferable for a detailed design using the flat data D10. Since a parallel (separate) process is made possible by dividing the data D10, a time preferable for a detailed design can be also more shortened. Sub-module D30 is generated by reflecting the result of the detailed result in the sub-module data D20.

The position is assigned to a block terminal taking into consideration the occurrence suppression of a detour and violation to be avoided. Thus, a more appropriate detailed design can be made. Since the occurrence of inconveniences in wiring can be suppressed, a wiring route can be rapidly searched and the frequency of the disposition modification of a cell can be suppressed. Therefore, a time preferable for a detailed design can be also shortened.

The flattening process unit 60 eliminates hierarchy caused by dividing a module into blocks and flattens data by merging a plurality of pieces of sub-module data D30. The flattened flat data D10 can be used as the input data of the area division unit 51 when performing some modification, change of the design and the like.

In the support apparatus having the above-described functional configuration, the process P2 is performed by the area division unit 51. The process P3 is performed by the already-wired terminal generation unit 52, the prohibition mapping unit 53, the terminal side setting unit 54, the wire length estimation unit 55, the assignment order determination unit 56 and the terminal assignment unit 57. The processes P4 and P5 are performed by the sub-module detailed design unit 59. The process P6 corresponds to merging a plurality of pieces of flat data 10 whose modification is not needed.

FIG. 20 is an example of the hardware configuration of a computer to which the preferred embodiment can be applied. The configuration of a computer that can be used as the support apparatus will be explained in detail below with reference to FIG. 20.

The computer illustrated in FIG. 20 includes a CPU 91, memory 92, an input device 93, an output device 94, an external storage device 95, a medium drive device 96 and a network connection device 97, which are connected to each other by a bus 98. The configuration illustrated in FIG. 20 is one example and is not restrictive of the invention.

The CPU 91 controls the entire computer.

The memory 92 is RAM and the like, for temporarily storing a program or data stored in the external storage device 95 (or a portable storage medium M) when executing the program, updating the data and so on. The CPU 91 controls the entire computer by reading the program into the memory 92 and executing it.

The input device 93 is, for example, an interface connected to an operation device, such a keyboard, a mouse or the like. It detects the operation of a user on the operation device and notifies the CPU 91 of its detection result.

The output device 94 is a display control device connected to, for example, a display device. The network connection device 97 is used to communicate with an external device via a communication network, such as an intra-net, the internet or the like. The external storage device 95 is, for example, a hard disk device. It is chiefly used to store various types of data and programs.

The medium drive device 96 is used to access the portable storage medium M, such as an optical disk, a magneto-optical disk or the like.

The flat data 10 can be stored in the storage device M via the external storage device 95, or the medium drive device 96, for example, by the CPU 91 executing a floor planner being a program for a floor plan. It can be also obtained from an external device via the network connection device 97. The sub-module data D20 and D30, the frame information D41, the cell extraction range information D42, the cell information D43, the prohibition information D44, the prohibition extraction range information D 52 and the terminal position control table D71, and the like, can be also stored in the storage device M via the external storage device 95, or the medium drive device 96.

The area division unit 51, the already-wired terminal generation unit 52, the prohibition mapping unit 53, the terminal side setting unit 54, the wire length estimation unit 55, the assignment order determination unit 56, the terminal assignment unit 57, the module division unit 58, the sub-module detailed design unit 59 and the flattening process unit 60 can be realized by the CPU 91 executing one program. In this preferred embodiment, since a detailed design is made using a well-known technology, the area division unit 51, the already-wired terminal generation unit 52, the prohibition mapping unit 53, the terminal side setting unit 54, the wire length estimation unit 55, the assignment order determination unit 56, the terminal assignment unit 57 and the module division unit 58 can be realized by one program (hereinafter called "layout design support program") and the sub-module detailed design unit 59 can be realized by executing a detailed design tool. The layout design support program can be stored in the external storage device 95 or the portable storage medium M. Alternatively, it can be obtained from an external device via the network connection device 97 from time to time.

Although in this preferred embodiment, a boundary is set avoiding a grid point in order to divide a module into blocks, it can be also adopted in order to divide a module into modules. Similarly, the assignment method of a block terminal position and the setting of a wiring prohibited range can be also adopted in order to divide a module into blocks.

As described above, when the present invention is applied, in order to support a layout design for determining the disposition and wiring of a cell constituting a semiconductor integrated circuit, a first module obtained by dividing the semiconductor integrated circuit is divided into a plurality of second modules (sub-modules) and makes the detailed design of a layout for determining the disposition and wiring of a cell in the second module.

By re-division into the second module, the number of target cells of the disposition and wiring in each of the second modules can be reduced. Therefore, a detailed design can be made for a shorter time. In the entire process, process time can be shortened.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiment of the present invention have been described in detail, it should be understood that the various changes, substitutions, and alterations could be made hereto without departing from the spirit and scope of the invention.

What is claimed is:

1. A layout design method of a semiconductor integrated circuit, the layout design method comprising:
    dividing by using a computer a first module obtained by parting the semiconductor integrated circuit into a plurality of second modules; and
    arranging by using the computer a layout for determining disposition of each cell in the second module for each second module divided in the first module, wherein
    in the dividing the first module, when there is a wire passing across a boundary between adjacent second modules, priority in assigning a position of a module terminal disposed on the boundary for the wire is determined on the basis of between two pins connected by the wire and a position of the module terminal is assigned for each of wires according to the priority, and
    in the arranging the layout, a detailed design is made using the position assigned to the module terminal.

2. The layout design method according to claim 1, wherein in the dividing the first module, the first module is divided into the plurality of the second modules by avoiding a grid used for wiring signal wirings and setting the boundary between the adjacent second modules.

3. The layout design method according to claim 1, wherein in the dividing the first module, a module terminal having width for connecting between two adjacent grid points pitching the boundary in a direction orthogonal to the boundary, is disposed on the boundary.

4. The layout design method according to claim 1, wherein a rectangle connecting between the two pins is assumed and the priority is determined on the basis of width with which the rectangle intersects the boundary and width in a direction orthogonal to the boundary of the rectangle.

5. The layout design method according to claim 1, wherein in the dividing the first module, a prohibition range in which the module terminal is not disposed is set on the boundary on the basis of an obstacle on a wire disposed in the neighborhood of the boundary and a position of the module terminal is assigned avoiding the prohibition range, and
    in the arranging the layout, the detailed design is made using the position assigned to the module terminal.

6. The layout design method according to claim 5, wherein the obstacle includes a cell whose disposition is determined, an existing wire and via hole.

7. A non-transitory computer readable storage medium that stores a layout design program of a semiconductor integrated circuit, the program causing a computer to perform:
    dividing a first module obtained by parting the semiconductor integrated circuit into a plurality of second modules; and
    arranging a layout for determining disposition of each cell in the second module for each second module divided in the first module, wherein
    in the dividing the first module, when there is a wire passing across a boundary between adjacent second modules, priority in assigning a position of a module terminal disposed on the boundary for the wire is determined on the basis of between two pins connected by the wire and a position of the module terminal is assigned for each of wires according to the priority, and in the arranging the layout, a detailed design is made using the position assigned to the module terminal.

8. The computer readable storage medium according to claim 7, wherein in the dividing the first module, the first module is divided into the plurality of the second modules by avoiding a grid used for wiring signal wirings and setting the boundary between the adjacent second modules.

9. The computer readable storage medium according to claim 7, wherein in the dividing the first module, a module terminal having width for connecting between two adjacent grid points pitching the boundary in a direction orthogonal to the boundary, is disposed on the boundary.

10. The computer readable storage medium according to claim 7, wherein a rectangle connecting between the two pins is assumed and the priority is determined on the basis of width with which the rectangle intersects the boundary and width in a direction orthogonal to the boundary of the rectangle.

11. The computer readable storage medium according to claim 7, wherein in the dividing the first module, a prohibition range in which the module terminal is not disposed is set on the boundary on the basis of an obstacle on a wire disposed in the neighborhood of the boundary and a position of the module terminal is assigned avoiding the prohibition range, and in the arranging the layout, the detailed design is made using the position assigned to the module terminal.

12. The computer readable storage medium according to claim 11, wherein the obstacle includes a cell whose disposition is determined, an existing wire and via hole.

13. A layout design support apparatus for supporting a layout design of a semiconductor integrated circuit, the layout design support apparatus comprising:

a first division unit that divides the semiconductor integrated circuit into a plurality of first modules;

a second division unit that divides the first modules into a plurality of second modules; and a detailed design unit that makes a detailed design of a layout for determining disposition of each cell and wiring in the second module for each second module divided by the first division unit, wherein the second division unit determines priority in assigning a position of a module terminal disposed on a boundary between adjacent second modules for a wire passing across the boundary, on the basis of between two pins connected by the wire when there is the wire passing across the boundary and assigns a position of the module terminal for each of wires according to the priority, and the detailed design unit makes the detailed design using the position assigned to the module terminal.

* * * * *